US012666960B2

(12) United States Patent
Chen et al.

(10) Patent No.: US 12,666,960 B2
(45) Date of Patent: Jun. 23, 2026

(54) METAL-INSULATOR-SILICIDE CAPACITORS

(71) Applicant: Taiwan Semiconductor Manufacturing Company, Ltd., Hsinchu (TW)

(72) Inventors: Kaochao Chen, Hsinchu City (TW); Chia-Cheng Ho, Hsinchu City (TW); Chan-Yu Hung, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 416 days.

(21) Appl. No.: 18/324,400

(22) Filed: May 26, 2023

(65) Prior Publication Data

US 2024/0395694 A1      Nov. 28, 2024

(51) Int. Cl.
H10W 20/40      (2026.01)
H10D 1/68      (2025.01)
H10D 84/00      (2025.01)
H10W 20/41      (2026.01)

(52) U.S. Cl.
CPC .......... H10W 20/496 (2026.01); H10D 1/692 (2025.01); H10D 84/212 (2025.01); H10W 20/435 (2026.01)

(58) Field of Classification Search
CPC ........... H01L 23/5223; H01L 23/5283; H10D 84/212; H10D 1/692; H10W 20/496; H10W 20/435

USPC ........................................................ 257/532
See application file for complete search history.

(56) References Cited

U.S. PATENT DOCUMENTS

2007/0057343 A1*   3/2007   Chinthakindi ........... H10D 1/68
                                                             257/532
2012/0241829 A1*   9/2012   Khan ..................... H10B 41/70
                                                             257/E21.409
2019/0096986 A1    3/2019   Hsu et al.
2021/0020739 A1    1/2021   Yeong et al.
2023/0050491 A1    2/2023   Then et al.
2023/0118003 A1    4/2023   Lim et al.

FOREIGN PATENT DOCUMENTS

TW            202042374 A      11/2020

* cited by examiner

*Primary Examiner* — Tu-Tu V Ho
(74) *Attorney, Agent, or Firm* — Eschweiler & Potashnik, LLC

(57)      ABSTRACT

Some embodiments relate to an integrated circuit including a semiconductor substrate. A silicide structure is disposed over the semiconductor substrate in a cross-sectional view. A dielectric structure is in direct contact with an upper surface of the silicide structure in the cross-sectional view. A metal structure is in direct contact with an upper surface of the dielectric layer in the cross-sectional view, such that the silicide structure and the metal structure establish a bottom electrode and a top electrode, respectively, which are spaced apart from one another by the dielectric structure to establish a metal-insulator-silicide capacitor over the semiconductor substrate.

20 Claims, 11 Drawing Sheets

300

300

500

500

600

600

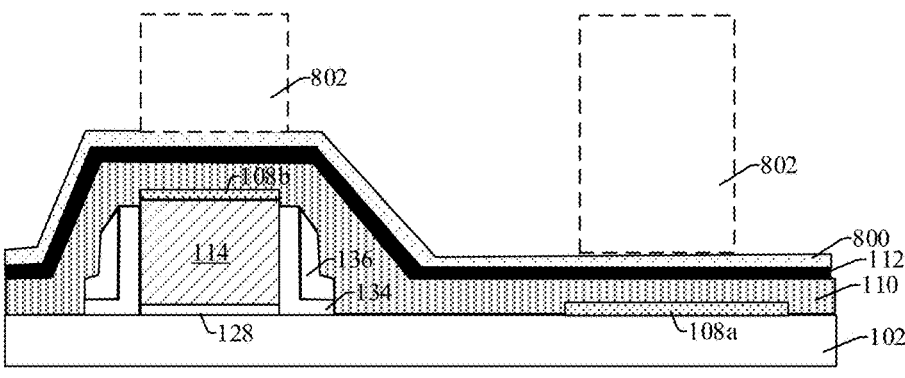
Fig. 8
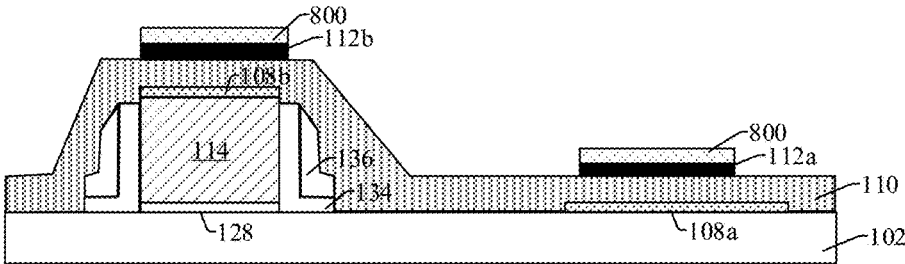
Fig. 9
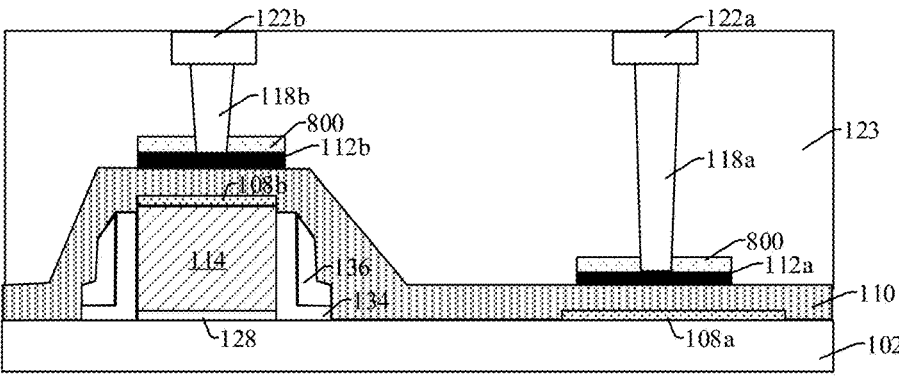
Fig. 10
Fig. 11

2000 ⟶

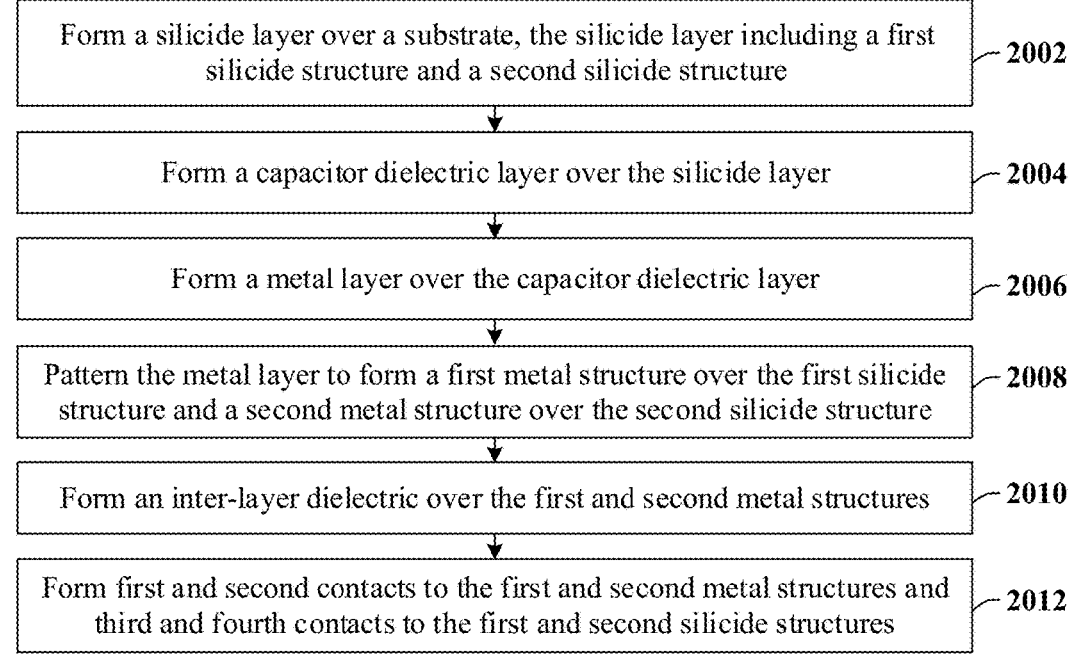

Form a silicide layer over a substrate, the silicide layer including a first silicide structure and a second silicide structure ~ 2002

Form a capacitor dielectric layer over the silicide layer ~ 2004

Form a metal layer over the capacitor dielectric layer ~ 2006

Pattern the metal layer to form a first metal structure over the first silicide structure and a second metal structure over the second silicide structure ~ 2008

Form an inter-layer dielectric over the first and second metal structures ~ 2010

Form first and second contacts to the first and second metal structures and third and fourth contacts to the first and second silicide structures ~ 2012

Fig. 20

METAL-INSULATOR-SILICIDE CAPACITORS

BACKGROUND

Modern day integrated chips comprise millions or billions of transistor devices, which are configured to enable logical functionality for an integrated chip (e.g., form a processor configured to perform logic functions). Often integrated chips may also comprise passive devices, such as capacitors, resistors, inductors, varactors, etc. Metal-insulator-metal (MIM) capacitors are a common type of passive device that is often integrated into the back-end-of-the-line metal interconnect layers of integrated chips. For example, MIM capacitors may be used as decoupling capacitors configured to mitigate power supply or switching noise (e.g., switching of input/output (I/O) and core circuits) caused by changes in current flowing through various parasitic inductances associated with an integrated chip and a package in which the integrated chip is located.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8 through 11 illustrate a manufacturing method as a series of incremental cross-sectional views according to some embodiments.

FIG. 20 illustrates a methodology in flowchart format that illustrates some embodiments of the present concept.

DETAILED DESCRIPTION

Figure 1A:
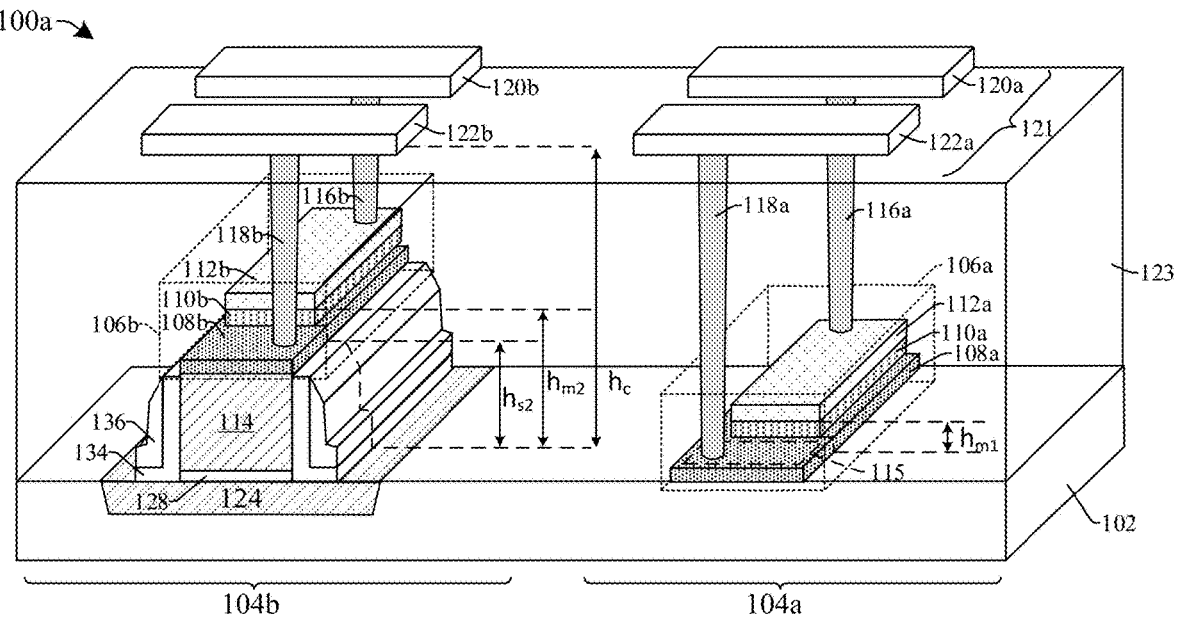
FIGS. 1A-1B illustrate perspective views of some embodiments of integrated circuits including metal-insulator-silicide capacitors, according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits or "chips" typically include a substrate and an interconnect structure over the substrate. The substrate includes devices that each have multiple terminals, and the interconnect structure includes a number of metal layers that are stacked over one another. The metal layers are generally referred to with consecutive numbers (e.g., the lowest metal layer is referred to as a metal1 layer, the next metal layer is referred to as a metal2 layer, the next metal layer is referred to as a metal3 layer, and so on, up to an Nth (top) metal layer, where N is any integer). Contacts extend from the lowest metal layer to the device terminals, and vias extend vertically between wiring segments of the various metal layers, such that the overall interconnect structure connects the terminals of the devices to one another and to bond pads in the uppermost metal layer to achieve a predetermined circuit configuration. The interconnect structure can also couple the devices to MIM capacitors, which are traditionally included in uppermost metal layers within the interconnect structure. For example, a MIM capacitor can have an upper electrode corresponding to the Nth metal layer and a lower electrode corresponding to a (N−1)th metal layer, with a capacitor dielectric between the upper and lower electrodes (and/or the upper and/or lower electrodes can be between the (N−1)th metal layer and Nth metal layer Some aspects of the present disclosure lie in the appreciation that the relatively long electrical path between the device terminals and such a MIM capacitor represents a relatively high resistance and a high manufacturing cost due to several depositions and a large number of masks for patterning.

To reduce the overall wiring length and correspondingly reduce resistance between devices and the MIM capacitors, the present disclosure provides metal-insulator-silicide structures which can have a lower electrode that corresponds to a silicide. The silicide can be disposed on an upper surface of the substrate or disposed on a polysilicon feature (e.g., polysilicon gate or polysilicon line) extending over the substrate. Compared to traditional approaches where the lower MIM electrode is in an upper metal layer, use of the silicide as the lower electrode reduces the resistance between the devices and the capacitor and also can reduce the number of masks involved in fabrication, thereby providing an improved device at a lower cost.

Referring to FIG. 1A, one can see a perspective view of an integrated circuit (IC) 100a in accordance with some embodiments. The IC 100a includes a semiconductor substrate 102 having a first device region 104a and a second device region 104b. A first metal-insulator-silicide capacitor 106a is disposed over the first device region 104a, and a second metal-insulator-silicide capacitor 106b is disposed over the second device region 104b. The metal-insulator-silicide capacitors can manifest in a number of different ways depending on the implementation, and several examples are now described below. The semiconductor substrate 102 can be a monocrystalline silicon substrate, a semiconductor-on-insulator (SOI) substrate, a silicon-on-insulator (SOI) substrate, a sapphire substrate, or some other substrate.

The first metal-insulator-silicide capacitor 106a includes a first silicide structure 108a disposed directly on the first device region 104a of the semiconductor substrate 102. A first dielectric structure 110a is disposed directly on the first silicide structure 108a. A first metal structure 112a is in direct contact with an upper surface of the first dielectric structure 110a. Thus, the first silicide structure 108a and the first metal structure 112a establish a first bottom electrode and a first top electrode, respectively, which are spaced apart from one another by the first dielectric structure 110a, thereby establishing the first metal-insulator-silicide capacitor 106a. In FIG. 1A, the first device region 104a can be a standalone region of the substrate 102 and/or can correspond to a terminal of a semiconductor device, and can be a doped region or an un-doped region of semiconductor material (e.g., monocrystalline silicon).

The second metal-insulator-silicide capacitor 106b is disposed over a polysilicon feature 114 extending over the second device region 104b of the semiconductor substrate 102. The second metal-insulator-silicide capacitor 106b includes a second silicide structure 108b disposed directly on the polysilicon feature 114. A second dielectric structure 110b is disposed directly on the second silicide structure 108b, and a second metal structure 112b is in direct contact with an upper surface of the second dielectric structure 110b. In this way, the second silicide structure 108b and the second metal structure 112b establish a second bottom electrode and a second top electrode, respectively, which are spaced apart from one another by the second dielectric structure 110b, thereby establishing the second metal-insulator-silicide capacitor 106b.

The first and second metal-insulator-silicide capacitors 106a, 106b can be used as decoupling capacitors, and/or can help stabilize voltages, reduce noise, and/or shift DC phases in the IC 100a. The first silicide structure 108a is arranged at a first silicide height over the upper surface of the substrate (e.g., first silicide height is zero due to direct contact between substrate 102 and first silicide structure 108a in FIGS. 1A-1B, and hence is not labeled), and the second silicide structure 108b is arranged at a second silicide height hs2 as measured normal to the upper surface of the substrate. The second silicide height is greater than the first silicide height. Similarly, the first metal structure 112a is arranged at a first metal height hm1 as measured normal to the upper surface of the substrate, and the second metal structure 112b is arranged at a second metal height hm2 over the upper surface of the substrate. The second metal hm2 height is greater than the first metal height hm1, and the second silicide height hs2 is greater than the first metal height hm1. It will be appreciated that the first metal height hm1 and second metal height hm2 are each less than a contact height hc corresponding to an interface where the upper surface of contacts 116/118 meets the lower surface of metal1 layer 121.

In some cases, the first and second silicide structures 108a, 108b can have the same composition as one another, and can for example, be made of a cobalt silicide (e.g., Co-Silicide), a nickel silicide (e.g., Ni-Silicide), a tantalum silicide (e.g., Ta-Silicide), or the like. Similarly, the first and second dielectric structures 110a, 110b can have the same composition as one another, and can for example be made of an oxide (e.g., silicon dioxide, SiO2), a nitride (e.g., silicon nitride, Si3N4) a carbide (e.g., silicon carbide, SiC), an oxynitride (e.g., silicon oxynitride, SiOxNy), an oxycarbide (e.g., silicon oxycarbide), a nitride carbide (e.g., silicon nitride carbide), a polymer, the like, etc. Further, the first and second metal structures 112a, 112b can have the same composition as one another and can for example be made of a metal or metal alloy, including copper, aluminum, nickel, tungsten, tantalum, titanium, and/or combinations thereof, among others. Using the same material compositions for the various layers allows for streamlined processing.

In some embodiments, the upper surface of the first silicide structure 108a has a first surface area, and the upper surface of the first metal structure 112a has a second surface area. The first surface area of the first silicide structure 108a is greater than the second surface area of the first metal structure 112a, such that the first metal structure 112a covers a first portion of the upper surface of the first silicide structure 108a but does not cover a second portion (e.g., 115) of the upper surface of the first silicide structure 108a. This arrangement allows for first contacts 116a, 116b to extend from the first portion of the upper surface of the metal structures 112a, 112b to first metal features 120a, 120b, respectively, through an interlayer dielectric 123, such as a low-k dielectric, arranged between the upper surface of substrate 102 and lower surface of metal1 layer 121. Second contacts 118a, 118b extend from the silicide structures 108a, 108b through the interlayer dielectric 123 to second metal features 122a, 122b, respectively. The second metal features 122a, 122b can have the same height as the first metal features 120a, 120b as measured perpendicularly from an upper surface of the semiconductor substrate 102, and can in some contexts be referred to as a metal1 layer 121 or other conductive layer in an interconnect structure over the substrate 102.

In FIG. 1A, the polysilicon feature 114 is disposed directly over a shallow trench isolation (STI) region 124 made of dielectric material in the substrate 102. Thus, in FIG. 1A, the second metal-insulator-silicide capacitor 106b is coupled to the polysilicon feature 114 and is spaced apart laterally and vertically from the first metal-insulator-silicide capacitor 106a. Thus, outer edges of the metal structures 112a, 112b can be spaced apart from one another, as can outer edges of the silicide structures 108a, 108b, and outer edges of the metal structures 112a, 112b can be aligned to outer edges of the dielectric structures 110a, 110b. The polysilicon feature 114 can comprise doped polycrystalline silicon and can be a linear or winding segment that extends laterally over an upper surface of the semiconductor substrate. In some cases, the polysilicon feature 114 can extend between terminals of two devices, for example between gates of two metal-oxide-semiconductor field-effect-transistors (MOSFETs), and/or can be a resistor. In some cases, a gate dielectric 128 can separate the lower surface of the polysilicon feature 114 from the STI region 124, and sidewall spacers, which include an inner spacer layer 134 and an outer spacer layer 136 can also be present. The inner spacer layer 134 can be silicon nitride, silicon oxide, or silicon oxynitride, among others, and the outer spacer layer 136 can have a different composition from the inner spacer layer or the same composition, and can comprise silicon nitride, silicon oxide, or silicon oxynitride.

Compared to traditional approaches where a MIM capacitor has a lower electrode that is at the top metal layer of an interconnect structure, use of silicide as the lower electrode as illustrated in FIG. 1A (wherein each silicide structure 108a, 108b can be lower than the lowermost metal layer 121) reduces the resistance between the devices and the lower electrode. This approach can reduce the number of masks involved in fabrication, thereby providing an improved device at a lower cost.

Figure 1B:
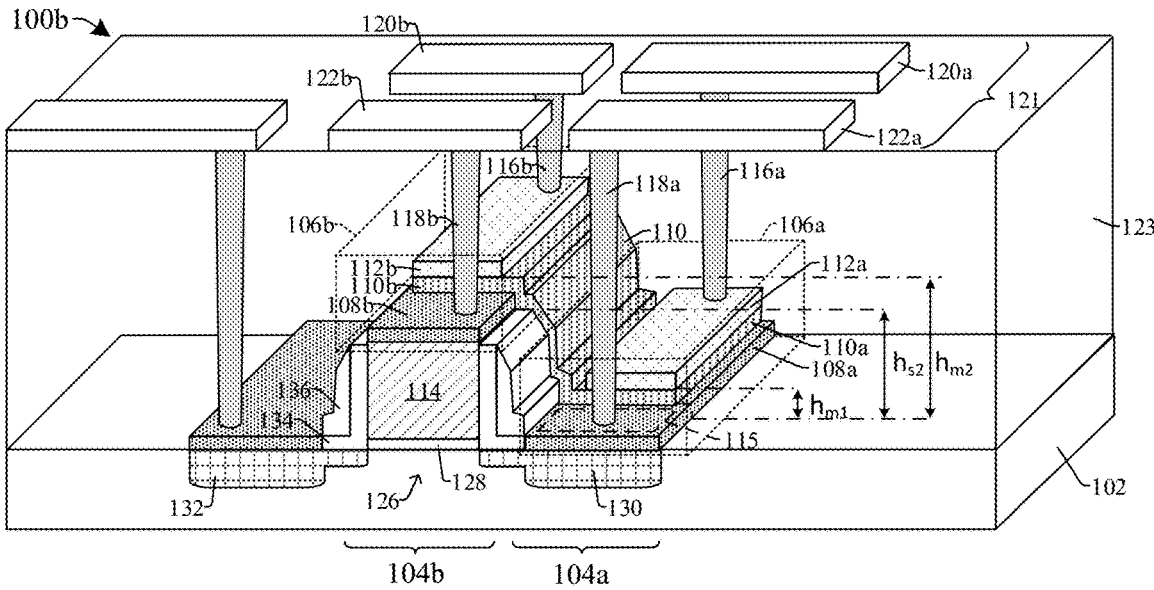

FIG. 1B shows another IC 100b that includes a first metal-insulator-silicide capacitor 106a disposed over a first device region 104a, and a second metal-insulator-silicide capacitor 106b is disposed over the second device region 104b. While IC 100b shares many features with 100a, in FIG. 1B the polysilicon feature 114 corresponds to a gate of a metal-oxide-semiconductor field effect transistor (MOSFET); while in FIG. 1A the polysilicon feature 114 was over an STI region 124. In FIG. 1B, the MOSFET includes a channel region 126 having a first conductivity disposed (e.g., n-type) in the substrate. The polysilicon feature 114 extends over the channel region 126, and is separated from the channel region 126 by a gate dielectric 128. A source 130 and a drain 132, which each have a second conductivity opposite the first conductivity type, are disposed in the substrate on opposite sides of the polysilicon feature 114. The first silicide structure 108a directly contacts an upper surface of the source 130; and the second silicide structure 108b directly contacts an upper surface of the polysilicon feature 114. Sidewall spacers, which include an inner spacer layer 134 and an outer spacer layer 136, can also be present.

Further, FIG. 1B illustrates an example where the first and second dielectric structures 110a, 110b for the first and second metal-insulator-silicide capacitors 106a, 106b are disposed in a single layer of dielectric material 110 that extends continuously over varying heights between the first and second metal-insulator-silicide capacitors 106a, 106b. It will be appreciated, however, that FIG. 1B could alternatively include separate first and second dielectric structures as shown in FIG. 1A, and/or FIG. 1A could alternatively include a single layer of dielectric material similar to shown in FIG. 1B.

Although FIGS. 1A-1B illustrate some examples, it will be appreciated that the lower electrodes of the metal-insulator-silicide capacitors of the present disclosure could be coupled to any doped or any un-doped monocrystalline regions and/or doped or un-doped polysilicon regions, or any conductive feature. Further, while FIG. 1B illustrates an example in the context of a MOSFET, the metal-insulator-silicide capacitors of the present disclosure are equally applicable to other semiconductors devices, such as Fin-FETs, bipolar junction transistors, junction FETs, high-voltage FETs, and/or diodes, among others. Further still, while FIGS. 1A-1B show examples where the upper surface of the semiconductor substrate is a continuous plane, in other embodiments the upper surface of the semiconductor substrate can have varying heights. For example in embodiments when a FinFET is employed in place of the MOSFET of FIG. 1B, the source/drain regions of the FinFET can be epitaxial source/drains whose upper surfaces are raised over a base upper surface of the substrate, and a polysilicon gate feature can have an upper surface above that of the epitaxial source/drains, and when metal-insulator-silicide capacitors are employed in such a FinFET they can still be analogous to FIGS. 1A-1B. Further, although metal electrodes are illustrated, other conductive materials can be used as well.

Figure 2A:
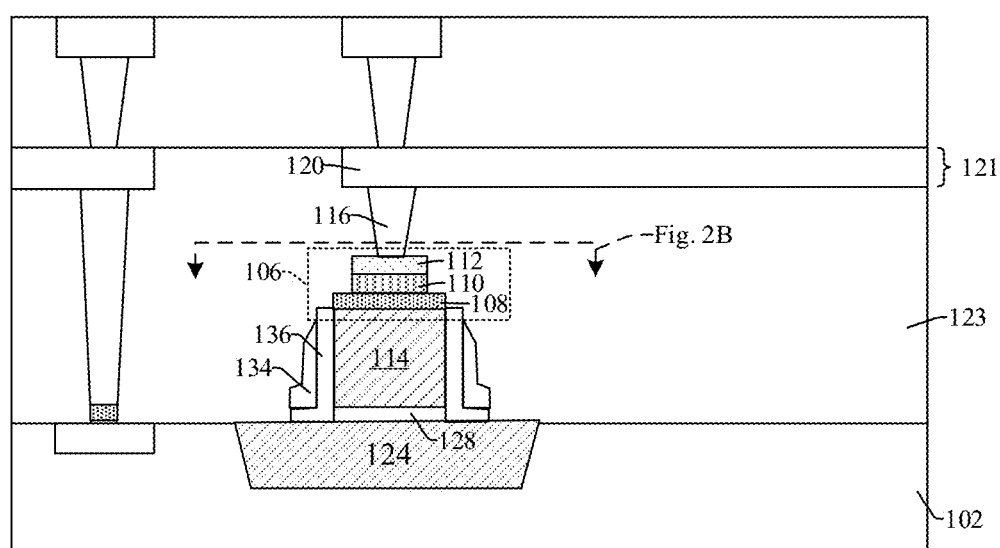
FIG. 2A and FIG. 2B illustrate a cross-sectional view and top view, respectively, of some embodiments of an integrated circuit including a metal-insulator-silicide capacitor.
Figure 2B:
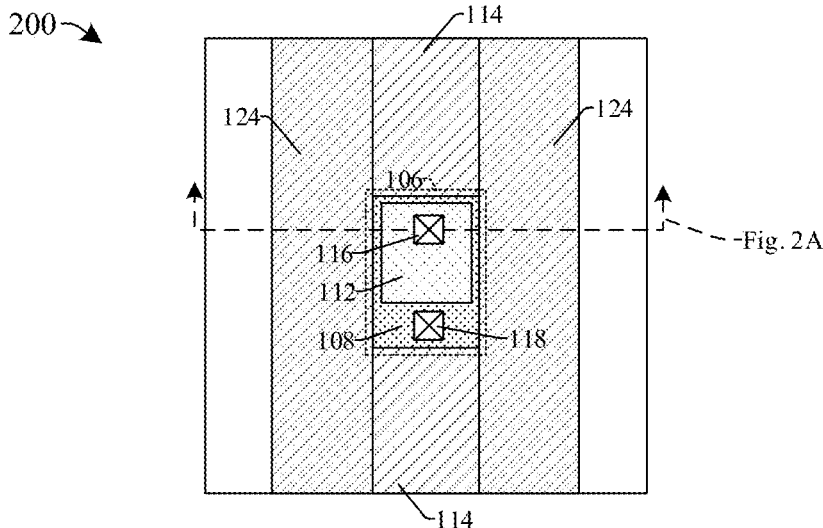

FIGS. 2A and 2B show a cross-sectional view and top view, respectively, of another example of an IC 200 in accordance with some embodiments. In FIGS. 2A-2B, a polysilicon feature 114 extends over a device region of a semiconductor substrate 102, which includes an STI region 124 made of dielectric material. A silicide structure 108 is disposed on the polysilicon feature 114. A dielectric structure 110 is disposed directly on the silicide structure 108, and a metal structure 112 is in direct contact with an upper surface of the dielectric structure 110. In this way, the silicide structure 108 and the metal structure 112 establish a bottom electrode and a top electrode, respectively, which are spaced apart from one another by the dielectric structure 110 to establish a metal-insulator-silicide capacitor 106 over the polysilicon feature 114.

Figure 3A:
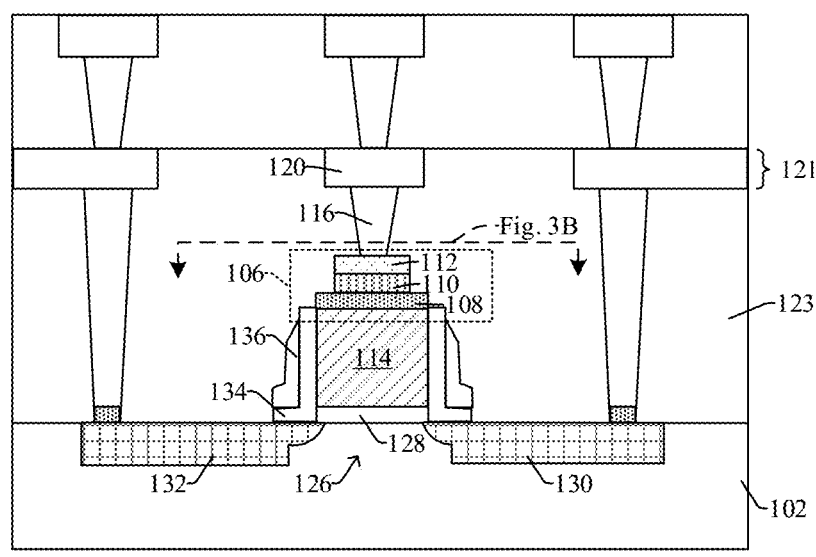
FIG. 3A and FIG. 3B illustrate a cross-sectional view and top view, respectively, of some embodiments of an integrated circuit including a metal-insulator-silicide capacitor.
Figure 3B:
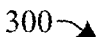
Figure 3B:
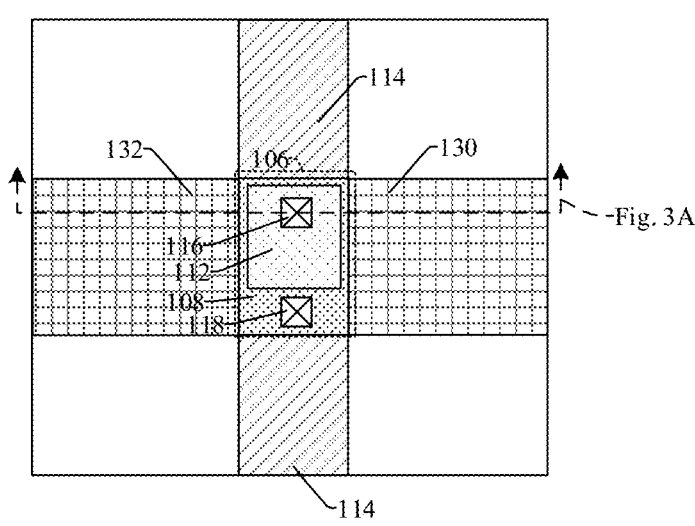

FIGS. 3A-3B show a cross-sectional and top view, respectively, of another example of an IC 300 in accordance with some embodiments. This IC includes a MOSFET having a gate corresponding to a polysilicon feature 114, a source 130, and a drain 132. The source 130 and drain 132 have a first conductivity type (e.g., n-type), and are separated from one another by a channel region 126 having a second conductivity type opposite the first conductivity type. The polysilicon feature 114 extends over the channel region 126, and is separated from the channel region 126 by a gate dielectric 128. Silicide regions are formed on the source 130, drain 132, and polysilicon feature 114. The silicide structure 108 over the polysilicon feature 114, along with the dielectric structure 110, and metal structure 112, establish a metal-insulator-silicide capacitor 106. The metal-insulator-silicide capacitor 106 is disposed over the upper surface of the polysilicon feature 114 and beneath a lower surface of the metal1 layer 121. In other cases, however, the polysilicon feature 114 and silicide structure 108 can also be in higher layers of the interconnect structure, such that the metal-insulator-silicide capacitor 106 is above the metal1 layer 121 but beneath the uppermost metal layer of the interconnect structure.

Figure 4A:
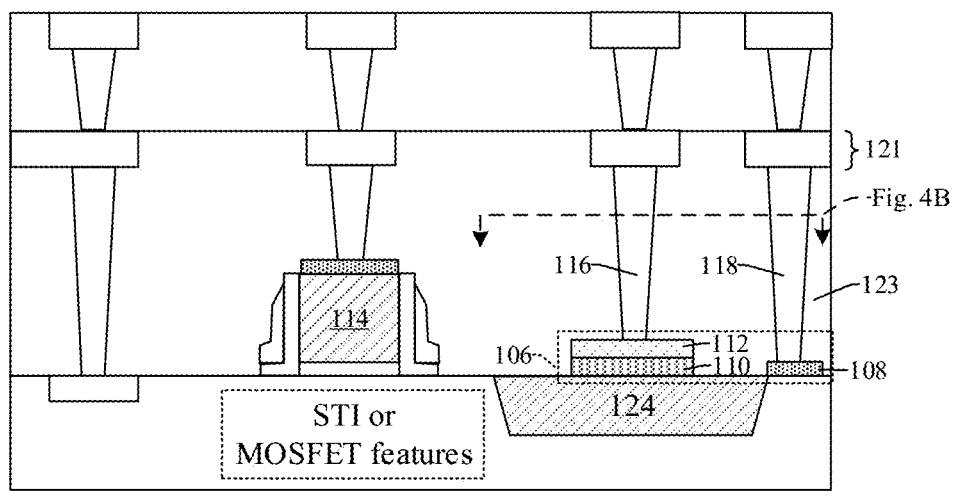
FIG. 4A and FIG. 4B illustrate a cross-sectional view and top view, respectively, of some embodiments of an integrated circuit including a metal-insulator-silicide capacitor.
Figure 4B:
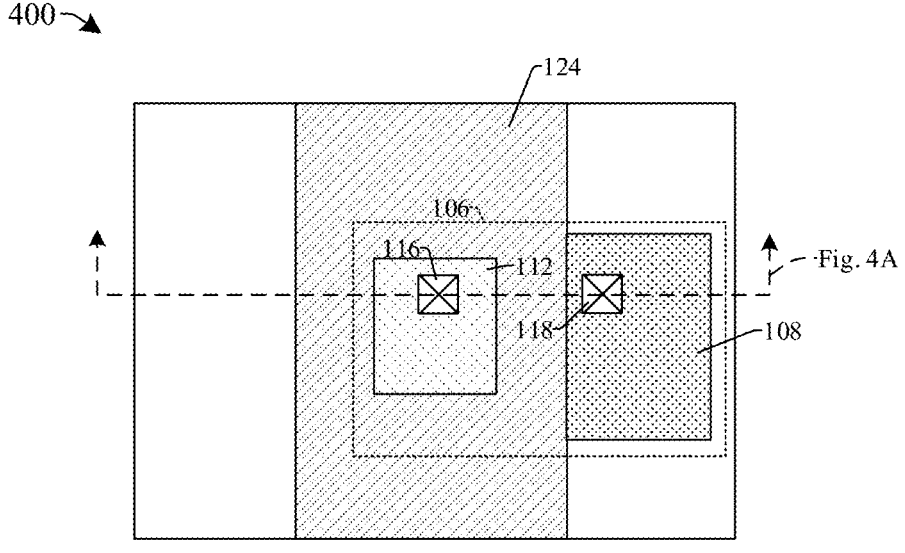

FIGS. 4A and 4B show a cross-sectional view and top view, respectively, of another example an IC 400 in accordance with some embodiments. In FIGS. 4A-4B, a polysilicon feature 114 extends over a device region of a semiconductor substrate 102. This device region can include an STI region 124 (e.g., similar to FIGS. 2A-2B) or can include MOSFET features (e.g., similar to FIGS. 3A-3B). A metal structure 112 (and optionally a dielectric structure 110) is disposed on an STI region 124. A silicide structure 108 is aligned along an edge of the STI region 124 over an upper surface of the semiconductor substrate 102. Thus, the silicide structure 108 can directly contact a sidewall of the STI region 124. In this way, the silicide structure 108 and the metal structure 112 establish a bottom electrode and a top electrode, respectively, which are spaced apart from one another by the STI region 124 and/or interlayer dielectric 123 to establish a metal-insulator-silicide capacitor 106.

Figure 5A:
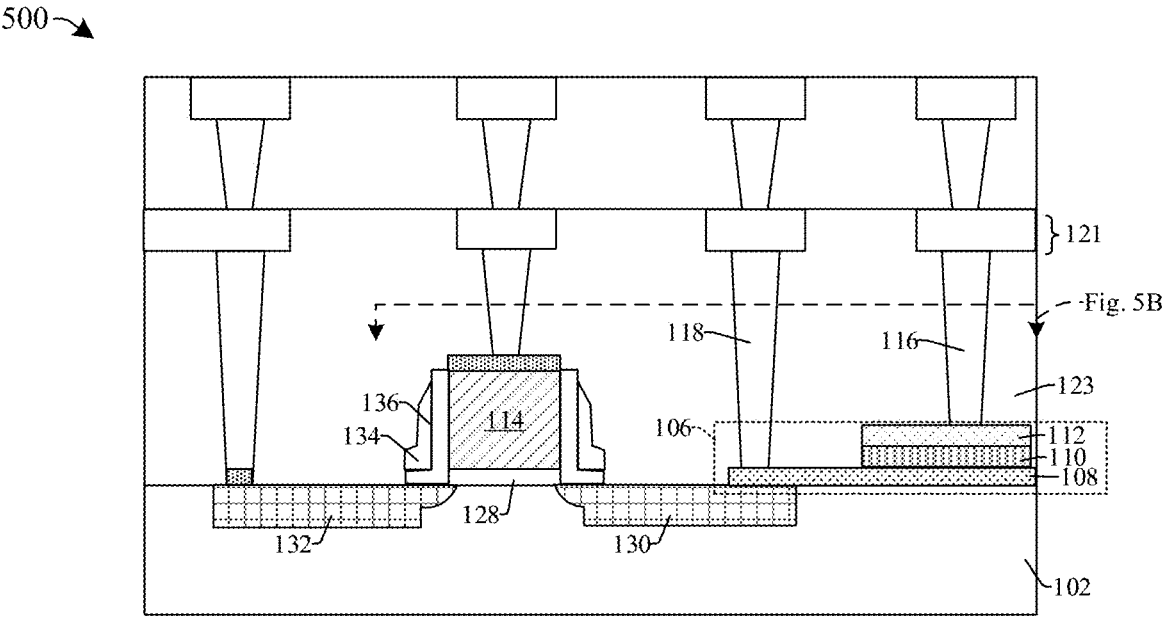
FIG. 5A and FIG. 5B illustrate a cross-sectional view and top view, respectively, of some embodiments of an integrated circuit including a metal-insulator-silicide capacitor.
Figure 5B:
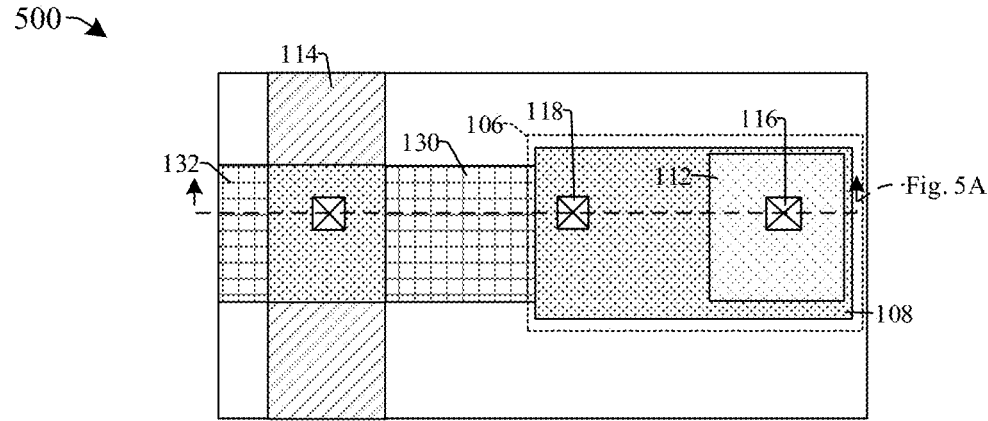

FIGS. 5A and 5B show a cross-sectional view and top view, respectively, of another example of an IC 500 in accordance with some embodiments. In FIGS. 5A-5B, the silicide structure 108 extends continuously from over the source 130 to beyond an outer edge of the source 130 over the upper surface of substrate 102. A dielectric material 110 and a metal structure 112 are disposed over the silicide structure 108.

Figure 6A:
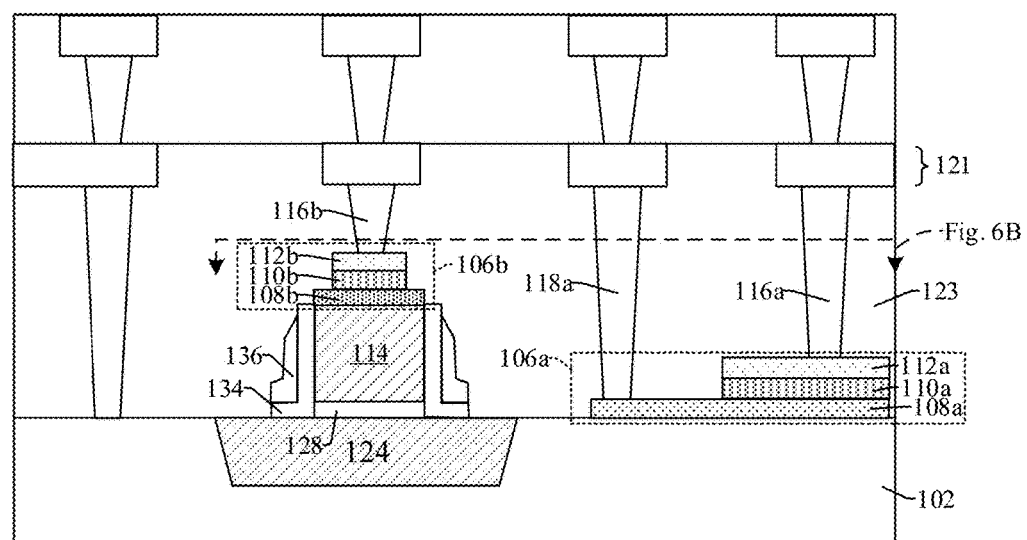
FIG. 6A and FIG. 6B illustrate a cross-sectional view and top view, respectively, of some embodiments of an integrated circuit including a metal-insulator-silicide capacitor.
Figure 6B:
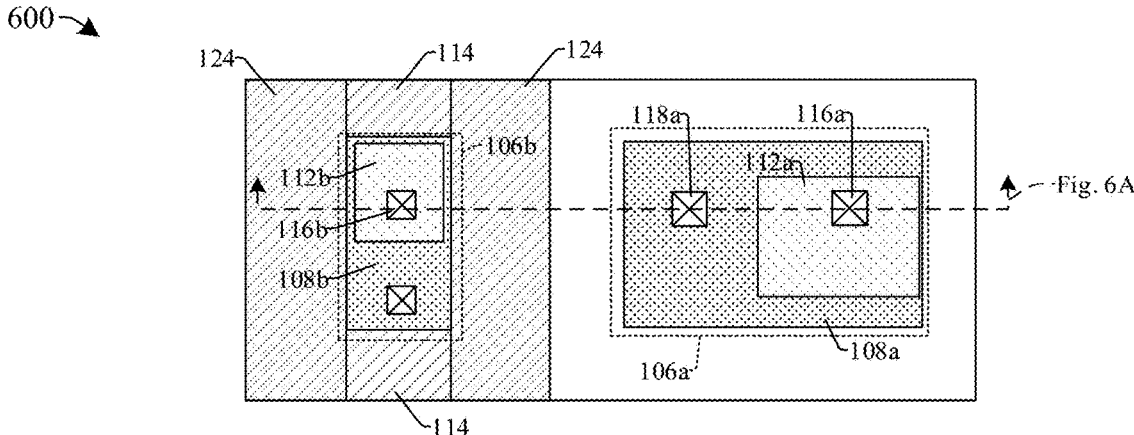

FIGS. 6A and 6B show a cross-sectional view and top view, respectively, of another example of an IC 600 in accordance with some embodiments. A dielectric structure 110a and a metal structure 112a are disposed over the silicide structure 108a. In FIG. 6A-6B, the portion of the substrate over which the silicide structure 108a extends can be intrinsic silicon, or can have a lower doping concentration, such as less than or equal to 10^16 defects/cm3, and can for example correspond to a well region.

Figure 7A:
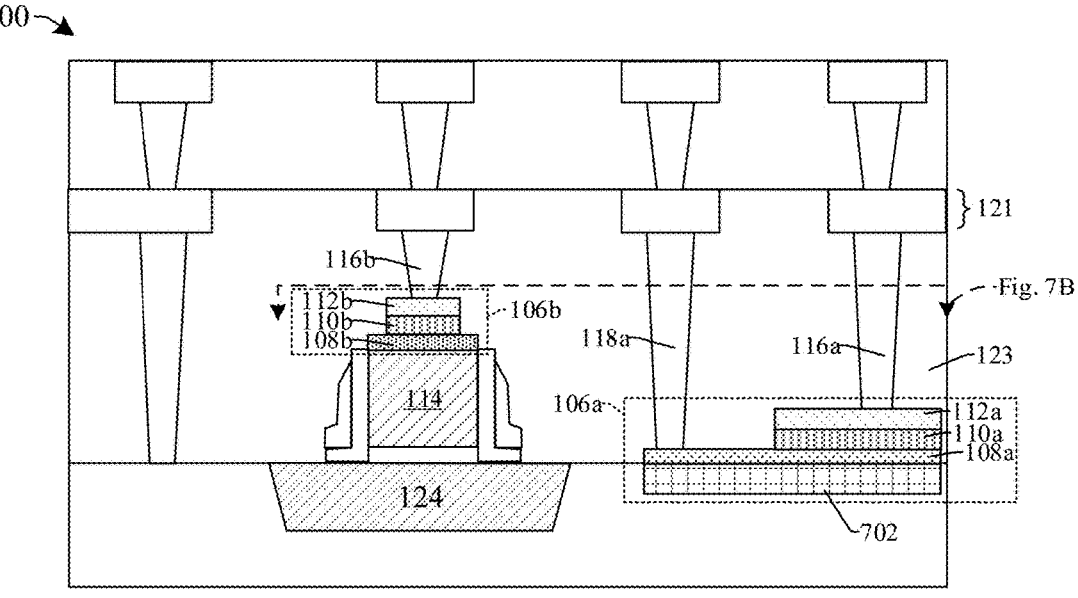
FIG. 7A and FIG. 7B illustrate a cross-sectional view and top view, respectively, of some embodiments of an integrated circuit including a metal-insulator-silicide capacitor.
Figure 7B:
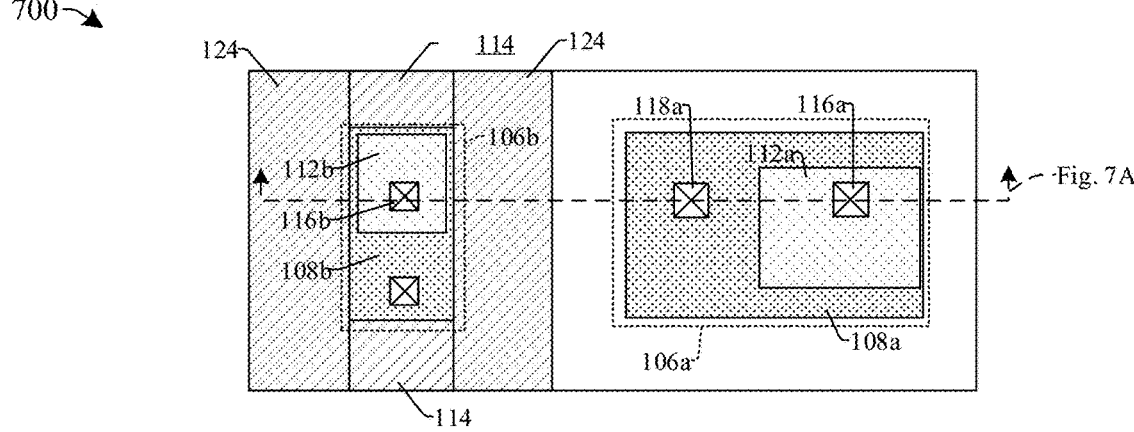

FIGS. 7A and 7B show a cross-sectional view and top view, respectively, of another example of an IC 700 in accordance with some embodiments. FIGS. 7A-7B are the same as FIGS. 6A-6B, except that in FIGS. 7A-7B, the portion 702 of the substrate over which the silicide structure 108a extends can have a high doping concentration, such as greater than 10^16 defects/cm3, and thus, can correspond to a source/drain region or other device terminal.

With reference to FIGS. 8 through 11, cross-sectional views of some embodiments of a method for manufacturing an integrated circuit including a metal-insulator-silicide capacitor at various stages of manufacture are provided. Although FIGS. 8-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

In FIG. 8, a polysilicon feature 114 has been patterned over a dielectric 128, and inner and outer sidewall layers 134, 136 are formed along sidewalls of the polysilicon feature 114. A silicide is then concurrently formed directly on an upper surface of the polysilicon feature and over a device region of the semiconductor substrate. In some embodiments, the silicide is formed over the entire upper surface of the polysilicon feature 114 as well as over an entire upper surface of the silicon substrate 102, and then is patterned (e.g., etched back) to establish a first silicide structure 108a and a second silicide structure 108b. In other cases, a dielectric material is formed over the polysilicon feature 114 and over the upper surface of the substrate 102, and then openings are formed in the dielectric material over the polysilicon feature 114 and over the upper surface of the substrate 102, and silicide is formed to be self-aligned in those openings, to establish first and second silicide structures 108a, 108b which may be referred to as salicide structures in such cases. After the first and second silicide structures 108a, 108b have been formed, a dielectric layer 110 is formed over the first and second silicide structures, and a metal layer 112 is formed over the dielectric layer. The dielectric layer 110 can be formed by a deposition process, such as chemical vapor deposition, atomic layer deposition, or others; while the metal layer 112 can be formed by sputtering, electroplating, or a another deposition process. The dielectric layer 110 and metal layer 112 can be formed as continuous layers over the substrate in some embodiments. A hardmask 800 is then formed over the metal layer 112, and a photoresist mask layer is formed and patterned (e.g., using photoresist and developer) over the hardmask, thereby providing a patterned photomask 802.

In some embodiments, the substrate 102 can be a bulk silicon substrate or a semiconductor-on-insulator (SOI) substrate (e.g., silicon on insulator substrate). The substrate 102 can also be a binary semiconductor substrate (e.g., GaAs), a tertiary semiconductor substrate (e.g., AlGaAs), or a higher order semiconductor substrate, for example. In many instances, the substrate manifests as a semiconductor wafer, and can have a diameter of 1-inch (25 mm); 2-inch (51 mm);

3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example.

In FIG. 9, a first etch is carried out to etch the hardmask 800 according to the patterned photomask 802. Thus, the first etch removes exposed portions of the hardmask, and generally leaves others portions of the hardmask covered by the photomask in place. The first etch can be a wet etch or a dry etch.

In FIG. 10, a second etch is carried out to etch the metal layer 112 according to the hardmask. Thus, the second etch removes exposed portions of the metal layer, and generally leaves first and second metal structures 112a, 112b covered by the hardmask 800. The second etch can be a wet etch or a dry etch, and can have a different chemistry from the first etch. The photomask 802 can also be removed, for example by an ashing process or a plasma etch. In alternative embodiments (not shown), the hardmask 800 can also be removed in FIG. 10.

In FIG. 11, an interlayer dielectric (ILD) 123 is formed over the dielectric layer 110 (and optionally over the hardmask 800 if still in place). Contact openings and metal1 line openings are formed in the interlayer dielectric 123. The contact openings extend downward through the hardmask 800 to expose an upper surface of the first and second metal structures 112a, 112b. Metal contacts 118a, 118b and metal1 lines 122a, 122b are then formed in the openings. A chemical mechanical planarization (CMP) process is then carried out to give the structure shown in FIG. 11.

With reference to FIGS. 12 through 15, cross-sectional views of some embodiments of an alternative method for manufacturing an integrated circuit including a metal-insulator-silicide capacitor at various stages of manufacture are provided. Although FIGS. 12-15 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 12:
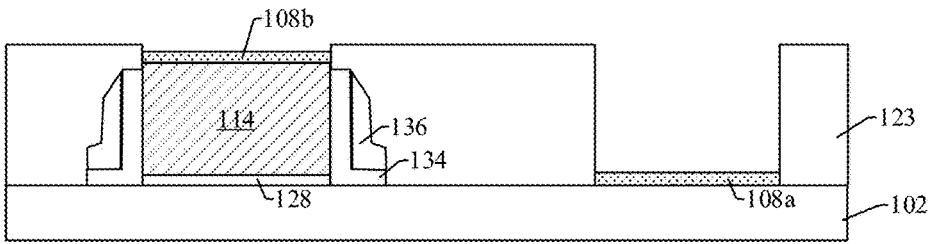
FIGS. 12 through 15 illustrate a manufacturing method as a series of incremental cross-sectional views according to some embodiments.

In FIG. 12, a polysilicon feature 114 has been patterned over a dielectric 128, and inner and outer sidewall layers 134, 136 are formed along sidewalls of the polysilicon feature 114. A dielectric material 123 is formed over the polysilicon feature 114 and over the upper surface of the substrate 102, and then openings are formed in the dielectric material over the polysilicon feature 114 and over the upper surface of the substrate 102. A silicide is formed, for example, by forming a metal layer over the exposed upper surfaces of the polysilicon feature 114 and substrate 102, where the metal layer reacts with the underlying silicon to form first and second silicide structures 108a, 108b. The first and second silicide structures 108a, 108b are thus self-aligned in the openings.

Figure 13:
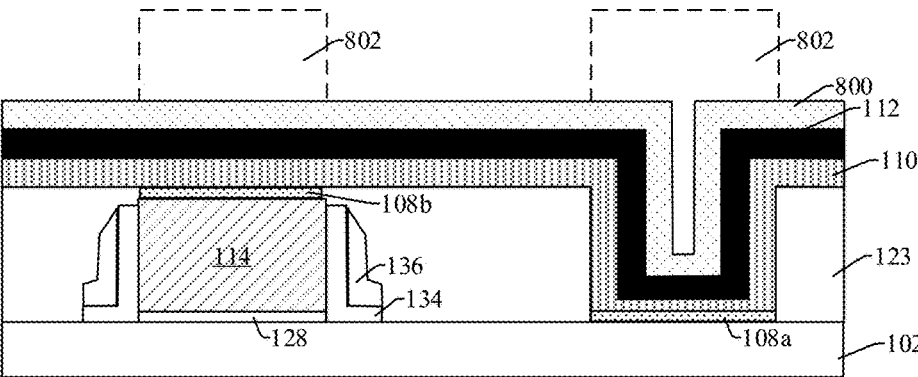

In FIG. 13, after the first and second silicide structures 108a, 108b have been formed, a dielectric layer 110 is formed over the first and second silicide structures, and a metal layer 112 is formed over the dielectric layer 110. The dielectric layer 110 can be formed by a deposition process, such as chemical vapor deposition, atomic layer deposition, or others; while the metal layer 112 can be formed by sputtering, electroplating, or a another deposition process. The dielectric layer 110 and metal layer 112 can be formed as continuous layers over the substrate in some embodiments. A hardmask 800 is then formed over the metal layer 112, and a photoresist mask layer is formed and patterned (e.g., using photoresist and developer) over the hardmask, thereby providing a patterned photomask 802.

Figure 14:
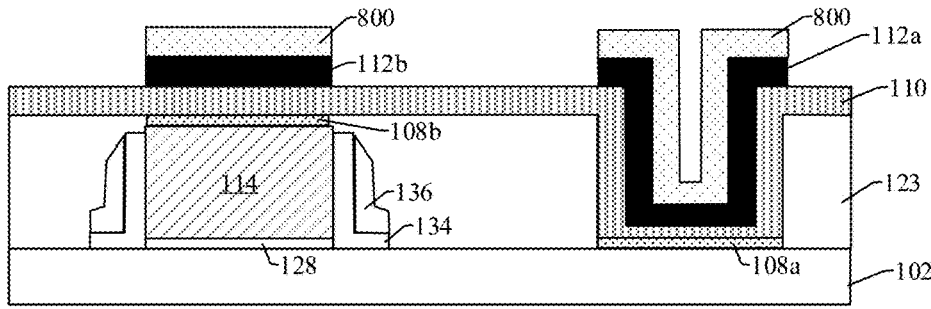

In FIG. 14, a first etch is carried out to etch the hardmask 800 according to the patterned photomask 802. Thus, the first etch removes exposed portions of the hardmask 800, and generally leaves others portions of the hardmask covered by the photomask in place. The first etch can be a wet etch or a dry etch.

In FIG. 14, a second etch is carried out to etch the metal layer 112 according to the hardmask. Thus, the second etch removes exposed portions of the metal layer, and generally leaves first and second metal structures 112a, 112b covered by the hardmask 800. The second etch can be a wet etch or a dry etch, and can have a different chemistry from the first etch. The photomask 802 can also be removed, for example by an ashing process or a plasma etch. In alternative embodiments (not shown), the hardmask 800 can also be removed in FIG. 14.

Figure 15:
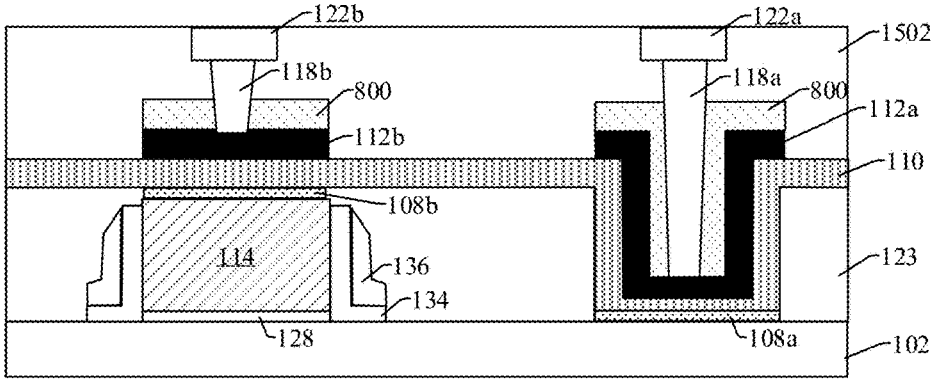
Figure 16:
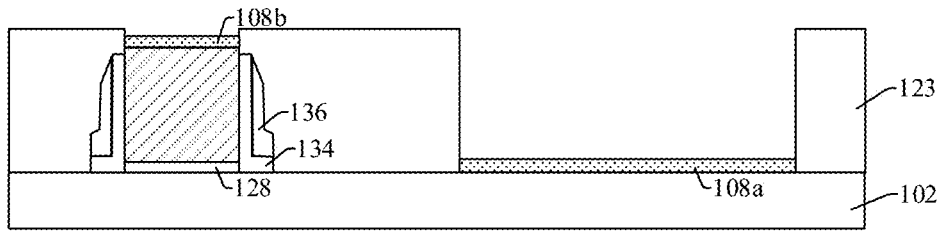
FIGS. 16 through 19 illustrate a manufacturing method as a series of incremental cross-sectional views according to some embodiments.
Figure 17:
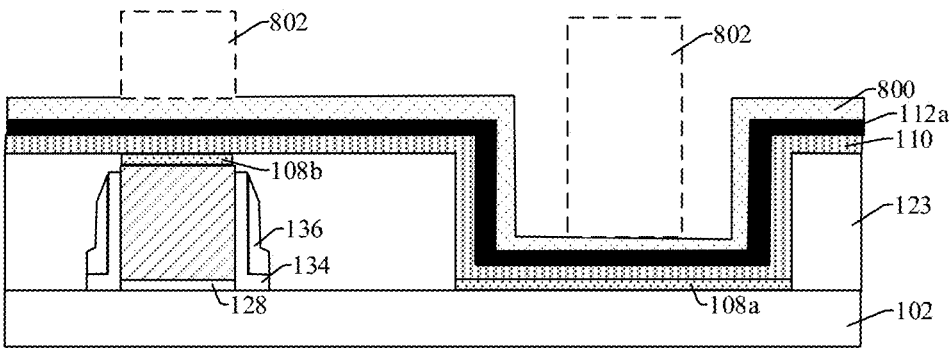
Figure 18:
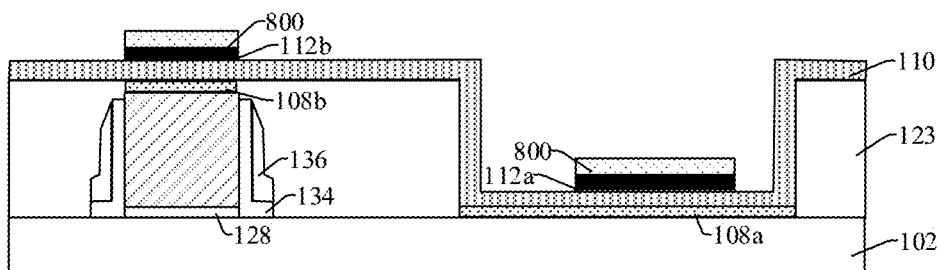
Figure 19:
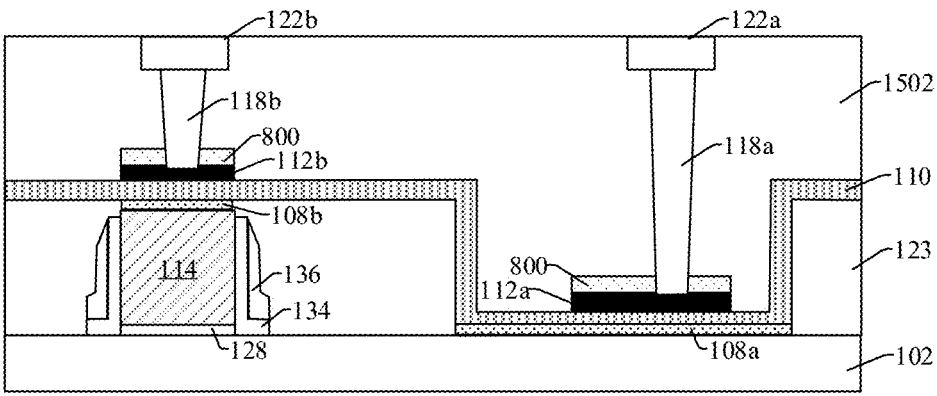

In FIG. 15, a second interlayer dielectric (ILD) structure 1502 is formed over the dielectric layer 110 (and optionally over the hardmask 800 if still in place). Contact openings and metal1 line openings are formed in the second ILD structure 1502. The contact openings extend downward through the hardmask 800 to expose an upper surface of the first and second metal structures 112a, 112b. Metal contacts 118a, 118b and metal1 lines 122a, 122b are then formed in the openings. A chemical mechanical planarization (CMP) process is then carried out to give the structure shown in FIG. 15.

FIGS. 16-19 illustrate another method similar to that of FIGS. 12-15, except the method of FIGS. 16-19 has a wider (e.g., larger) silicide structure on the substrate 102. Thus, in FIGS. 16-19, the metal structure 112a is a planar features that resides on a lower portion of the dielectric layer 110; whereas the metal structure 112a in FIGS. 12-15 had a U-shaped cross-sectional profile.

FIG. 20 shows a flowchart 2000 for manufacturing an integrated circuit in accordance with some embodiments.

In act 2002, a silicide layer is formed over a substrate. In some cases, the silicide layer can include a first silicide structure and a second silicide structure, which are at different heights over the substrate. In some embodiments, act 2002 can correspond for example to FIG. 8, FIG. 12, or FIG. 16.

In act 2004, a capacitor dielectric layer is formed over the silicide layer. In some embodiments, the capacitor dielectric layer includes separate dielectric structures over the first silicide structure and second silicide structures, respectively; but in other cases, the capacitor dielectric layer is a continuous dielectric layer that extends between the first and second silicide structures. In some embodiments, act 2004 can correspond for example to FIG. 8, FIG. 13, or FIG. 17.

In act 2006, a metal layer is formed over the capacitor dielectric layer. In some embodiments, act 2006 can correspond for example to FIG. 8, FIG. 13, or FIG. 17.

In act 2008, the metal layer is patterned to form a first metal structure over the first silicide structure and a second metal structure over the second silicide structure. In some embodiments, act 2008 can correspond for example to FIG. 9, FIG. 14, or FIG. 18.

In act 2010, an inter-layer dielectric is formed over the first and second metal structures. In some embodiments, act 2010 can correspond for example to FIG. 11, FIG. 15, or FIG. 19.

In act 2012, first and second contacts are formed to contact to the first and second metal structures, and third and fourth contacts are formed to contact the first and second silicide structures. In some cases, the first, second, third, and fourth contacts are formed simultaneously with one another. In some embodiments, act 2012 can correspond for example to FIG. 11, FIG. 15, or FIG. 19.

Some embodiments relate to an integrated circuit including a semiconductor substrate. A silicide structure is disposed over the semiconductor substrate in a cross-sectional view. A dielectric structure is in direct contact with an upper surface of the silicide structure in the cross-sectional view. A metal structure is in direct contact with an upper surface of the dielectric layer in the cross-sectional view, such that the silicide structure and the metal structure establish a bottom electrode and a top electrode, respectively, which are spaced apart from one another by the dielectric structure to establish a metal-insulator-silicide capacitor over the semiconductor substrate.

Other embodiments relate to an integrated circuit (IC) including a semiconductor substrate including a first device region and a second device region. A first silicide structure is disposed on the first device region of the semiconductor substrate. A first dielectric structure is disposed directly on the first silicide structure. A first metal structure is in direct contact with an upper surface of the first dielectric structure, such that the first silicide structure and the first metal structure establish a first bottom electrode and a first top electrode, respectively, which are spaced apart from one another by the first dielectric structure to establish a first metal-insulator-silicide capacitor over the first device region. A polysilicon feature extends over the second device region of the semiconductor substrate. A second silicide structure is disposed on the polysilicon feature. A second dielectric structure is disposed directly on the second silicide structure. A second metal structure is in direct contact with an upper surface of the second dielectric structure, such that the second silicide structure and the second metal structure establish a second bottom electrode and a second top electrode, respectively, which are spaced apart from one another by the second dielectric structure to establish a second metal-insulator-capacitor over the polysilicon feature.

Still other embodiments relate to a method. In the method, a silicide layer is formed over a substrate. The silicide layer includes a first silicide structure and a second silicide structure. A capacitor dielectric layer is formed over the silicide layer. A metal layer is formed over the capacitor dielectric layer. The metal layer is patterned to form a first metal structure over the first silicide structure and a second metal structure over the second silicide structure. An inter layer dielectric is formed over the first and second metal structures. First and second contacts are formed to the first and second metal structures and third and fourth contacts to the first and second silicide structures.

It will be appreciated that in this written description, as well as in the claims below, the terms "first", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a semiconductor substrate;
a channel region having a first conductivity disposed in the semiconductor substrate;
a gate feature extending over the channel region;
a gate dielectric separating the gate feature from the channel region;
a source region having a second conductivity disposed in the semiconductor substrate to a first side of the gate feature, the second conductivity opposite the first conductivity;
a drain region having the second conductivity disposed in the semiconductor substrate to a second side of the gate feature, the second side being opposite the first side;
a silicide structure disposed over the semiconductor substrate in a cross-sectional view, wherein the silicide structure directly contacts an upper surface of the source region or the drain region;
a dielectric structure in direct contact with an upper surface of the silicide structure in the cross-sectional view; and
a metal structure in direct contact with an upper surface of the dielectric structure in the cross-sectional view, such that the silicide structure, the dielectric structure, and the metal structure establish a metal-insulator-silicide capacitor over the semiconductor substrate.

2. The IC of claim 1, wherein the silicide structure and the metal structure establish a bottom electrode and a top electrode, respectively, which are spaced apart from one another by the dielectric structure to establish the metal-insulator-silicide capacitor over the semiconductor substrate.

3. The IC of claim 1, wherein the upper surface of the silicide structure has a first surface area, and an upper surface of the metal structure has a second surface area; and wherein the first surface area is greater than the second surface area.

4. The IC of claim 1, wherein the metal structure covers a first portion of the upper surface of the silicide structure but does not cover a second portion of the upper surface of the silicide structure.

5. The IC of claim 4, further comprising:
a first metal feature arranged over the first portion of the upper surface of the silicide structure and spaced apart from the first portion of the upper surface of the silicide structure by a dielectric;
a first contact extending from the first metal feature through the dielectric and contacting the first portion of the upper surface of the silicide structure; and
a second metal feature arranged over the first metal feature and spaced apart from the first metal feature by the dielectric, the second metal feature having the same height as the first metal feature as measured perpendicularly from an upper surface of the semiconductor substrate and spaced laterally apart from the first metal feature; and
a second contact extending from the second metal feature through the dielectric and contacting the metal structure.

6. The IC of claim 1, further comprising:
a shallow trench isolation (STI) region of dielectric material disposed in the semiconductor substrate; and
a polysilicon feature extending over the STI region; and
wherein the silicide structure directly contacts an upper surface of the polysilicon feature and is disposed directly over the STI region.

7. The IC of claim 1, further comprising:
a second silicide structure directly contacting an upper surface of the gate feature.

8. The IC of claim 7, further comprising:
a second dielectric structure disposed directly on the second silicide structure; and
a second conductive structure in direct contact with an upper surface of the second dielectric structure.

9. The IC of claim 8, wherein the dielectric structure and the second dielectric structure are portions of a single dielectric layer extending continuously from over the silicide structure to over the second silicide structure.

10. The IC of claim 1, further comprising:
a shallow trench isolation (STI) region of dielectric material disposed in the semiconductor substrate;
wherein the silicide structure directly contacts a sidewall of the STI region.

11. The IC of claim 1, wherein the metal structure is disposed at a first height above the substrate, and the first height is less than a height corresponding to an upper surface of the gate feature.

12. An integrated circuit (IC), comprising:
a semiconductor substrate;
a gate electrode extending over the semiconductor substrate;
a first silicide structure disposed on the gate electrode;
a first dielectric structure disposed directly on the first silicide structure; and
a first conductive structure in direct contact with an upper surface of the first dielectric structure, such that the first silicide structure and the first conductive structure establish a first bottom electrode and a first top electrode, respectively, which are spaced apart from one another by the first dielectric structure to establish a first conductor-insulator-silicide capacitor over the gate electrode;
a second silicide structure disposed on the semiconductor substrate and spaced laterally apart from the gate electrode;
a second dielectric structure disposed directly on the second silicide structure;
a second conductive structure in direct contact with an upper surface of the second dielectric structure, such that the second silicide structure and the second conductive structure establish a second bottom electrode and a second top electrode, respectively, which are spaced apart from one another by the second dielectric structure to establish a second conductor-insulator-silicide capacitor,
wherein the first dielectric structure and the second dielectric structure are portions of a single dielectric layer extending continuously from over the first silicide structure to over the second silicide structure.

US 12,666,960 B2

13

13. The IC of claim 12, further comprising:
a dielectric layer laterally surrounding the gate electrode
and the first conductive structure and extending over
the first conductive structure; and
a contact extending through the dielectric layer and along-
side the first conductive structure and the first dielectric
structure to contact an upper surface of the first silicide
structure.

14. The IC of claim 12, wherein the first silicide structure
is arranged at a first silicide height over the semiconductor
substrate, and the second silicide structure is arranged at a
second silicide height over the semiconductor substrate, the
second silicide height being greater than the first silicide
height.

15. The IC of claim 12, wherein the gate electrode is
disposed at a first height above the substrate, and the first
height is greater than a second height corresponding to an
upper surface of the second conductive structure.

16. A method, comprising:
forming a silicide layer over a substrate, the silicide layer
including a first silicide structure and a second silicide
structure;
forming a capacitor dielectric layer over the silicide layer;
forming a metal layer over the capacitor dielectric layer;

patterning the metal layer to form a first metal structure
over the first silicide structure and a second metal
structure over the second silicide structure;
forming an inter-layer dielectric over the first and second
metal structures; and
forming first and second contacts to the first and second
metal structures and third and fourth contacts to the first
and second silicide structures.

17. The method of claim 16, wherein the first silicide
structure and the second silicide structure are arranged at
different heights over the substrate.

18. The method of claim 16, wherein the capacitor dielec-
tric layer is a continuous dielectric layer that extends
between the first and second silicide structures.

19. The method of claim 16, wherein the first and second
contacts and the third and fourth contacts are formed simul-
taneously with one another.

20. The method of claim 16, wherein the first silicide
structure and the second silicide structure comprise cobalt,
nickel, or tantalum; and wherein the capacitor dielectric
layer comprises an oxide, a nitride, a carbide, an oxynitride,
an oxycarbide, a nitride carbide, or a polymer; and the first
and second metal structures have the same composition as
one another and comprise a metal or a metal alloy.

* * * * *